United States Patent [19]

McDiarmid

[11] Patent Number: 5,242,501
[45] Date of Patent: Sep. 7, 1993

[54] SUSCEPTOR IN CHEMICAL VAPOR DEPOSITION REACTORS

[75] Inventor: James McDiarmid, San Jose, Calif.

[73] Assignee: LAM Research Corporation, Fremont, Calif.

[21] Appl. No.: 376,950

[22] Filed: Jul. 7, 1989

Related U.S. Application Data

[63] Continuation of Ser. No. 113,342, Oct. 20, 1987, abandoned, which is a continuation of Ser. No. 868,240, May 27, 1986, abandoned, which is a continuation-in-part of Ser. No. 727,181, Apr. 25, 1985, abandoned, which is a continuation of Ser. No. 416,541, Sep. 10, 1982, abandoned.

[51] Int. Cl.$^5$ .............................................. C30B 35/00
[52] U.S. Cl. ................................. 118/728; 219/10.67; 422/245; 156/612; 373/138
[58] Field of Search ............... 118/715, 716, 717, 719, 118/720, 728, 500, 730; 422/245, 247; 156/612; 219/10.49 R, 10.67; 373/138

[56] References Cited

U.S. PATENT DOCUMENTS

| | | | |
|---|---|---|---|
| 3,128,205 | 4/1964 | Illsley | 118/730 |
| 3,436,255 | 4/1969 | Harris et al. | 156/612 |
| 3,539,759 | 11/1970 | Spiro et al. | 219/10.49 R |
| 3,749,058 | 7/1973 | Slabaugh | 118/730 |
| 3,858,547 | 1/1975 | Bergfelt | 118/730 |
| 3,892,940 | 7/1975 | Bloem et al. | 219/10.49 R |
| 4,099,041 | 7/1978 | Berkman et al. | 219/10.49 R |
| 4,365,588 | 12/1982 | Jolly | 118/500 |
| 4,503,807 | 3/1985 | Nakayama et al. | 118/719 |

FOREIGN PATENT DOCUMENTS 50-12971 2/1975 Japan.
55-95320 7/1980 Japan.
4-862811 2/1992 Japan.

OTHER PUBLICATIONS

Van Nos Nostrand's *Scientific Encyclopedia*, 5th Edition (1976), 2 pages.
Robinson et al., "Low Dislocation Density R-F Heated Epitaxial Silicon", J. Electrochem. Soc. Sol. St. Sci. and Tech., vol. 129, No. 12, Dec. 1982, pp. 2858-2860.

Primary Examiner—R. Bruce Breneman
Attorney, Agent, or Firm—Burns, Doane, Swecker & Mathis

[57] ABSTRACT

An improved chemical reactor of the type for depositing a layer of material epitaxially onto a wafer of single crystalline silicon is disclosed. The reactor has a susceptor for supporting each wafer in a cavity of the susceptor with the cavity being curvilinearly shaped. Cavities of a particular shape and dimensions is particularly effective in reducing dislocations in the deposited epitaxial layer.

2 Claims, 2 Drawing Sheets

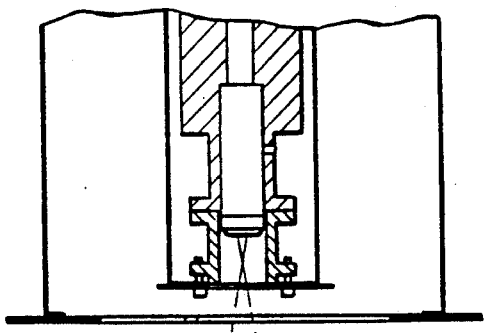
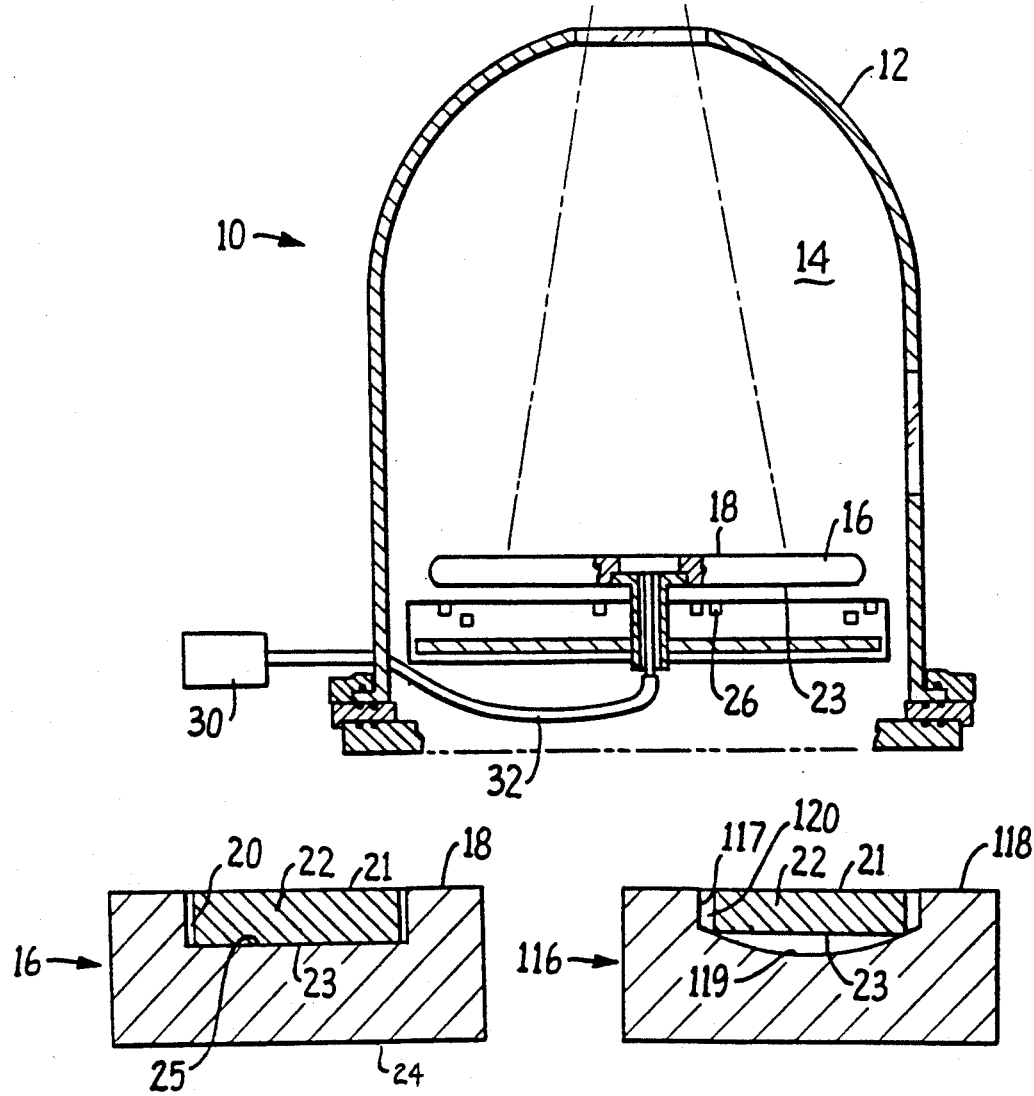
FIG. 1.
FIG. 2.
(PRIOR ART)
FIG. 3.

SUSCEPTOR IN CHEMICAL VAPOR DEPOSITION REACTORS

DESCRIPTION

This is a continuation of application Ser. No. 113,342, filed Oct. 20, 1987, now abandoned, which in turn is a continuation of application Ser. No. 868,240, filed May 27, 1986, now abandoned, which is a continuation-in-part of U.S. application Ser. No. 727,181, filed Apr. 25, 1985, now abandoned which is a continuation of U.S. application Ser. No. 416,541, filed Sep. 10, 1982, now abandoned.

TECHNICAL FIELD

The present invention relates to an improved chemical vapor deposition (CVD) reactor for growing a layer of material epitaxially onto a single crystalline wafer and, more particularly, to the structure of susceptor cavities for holding the wafer in the epitaxial CVD reactors.

BACKGROUND ART

A chemical reactor for depositing a layer of material epitaxially onto a disc-shaped wafer of single crystalline silicon is well known in the art. The wafers have typical dimensions of three inches (7.62 cm.), four inches (10.16 cm.), five inches (12.7 cm.), or six inches (15.24 cm.) in diameter. Typically, the chemical reactor to deposit the epitaxial layer has been of two types.

In one type, the wafers are supported on an inclined support plate, mounted vertically, called a susceptor, which is typically made from graphite. The wafers and the susceptor are placed in a reaction chamber. Gases are passed into the reaction chamber. The wafer and susceptor are heated to a high temperature, typically 900-1250 degrees centigrade, by either infrared lamps or a radio frequency energized coil. Thermal energy from the lamps directly heat the front side of the wafers with the back side of the wafers resting against the susceptor. The radio frequency induced currents from the coil first heat the susceptor, which, in turn, heats the back side of the wafers resting against the susceptor by a combination of conduction, convection and radiation. The process gases introduced into the chamber then react and are deposited epitaxially onto the wafer.

In a second type of chemical reactor, the wafers are also supported on a susceptor, which is mounted horizontally and is also typically made from graphite. The wafers are supported in a cylindrically shaped cavity in the front of the susceptor. Radio frequency energy is supplied to a copper coil which heats the susceptor, thereby heating the wafers through a combination of conduction, convection and radiation from the graphite susceptor. This causes the wafer to be heated primarily by thermal contact between the bottom surface of the wafer and the top surface of the susceptor. The wafers can be heated by a combination of heat sources located in the front and in the back of the susceptor. The heat source can be either infrared energy from lamps or radio frequency energy supplied to a copper coil.

After the layer is epitaxially deposited, the wafer is further processed to make semiconductor devices.

For all these reactors, the differential temperature between the susceptor and wafer produces temperature gradients between the top and bottom surfaces of the wafer, as well as radially between the center and outside edges of the wafer. It is desirable that the wafer be kept at a relatively constant temperature during the heating cycle, thereby reducing the amount of thermal stress on the wafer. The stress induced by temperature gradients is relieved by the generation of crystallographic dislocations (or slip) in the atomic structure of the wafer as well as in the epitaxially deposited layer.

Dislocations or slip in the wafer and in the layer of material deposited epitaxially onto the wafer are believed to be sinks for impurities and can be the cause of diode leakage and emitter-collector shorts in the bipolar circuit devices that are ultimately manufactured from the wafer. In addition, for MOS devices, slips can cause leakage and deteriorate the performance of the device. Thus, reduction or elimination of dislocations in the epitaxially grown layer and in the wafer is important in reducing rejects and improving the yield of certain semiconductor devices.

SUMMARY OF THE INVENTION

In the present invention, an improved chemical reactor for depositing a layer of material epitaxially onto a substantially single crystalline wafer has a means for supporting the wafer. The support means has a curvilinearly shaped cavity in one surface for supporting the wafer in the cavity. Means for heating the wafer is provided. Finally, means for introducing the material into the reactor and means for depositing the layer of material epitaxially onto the wafer are also provided.

BRIEF DESCRIPTION OF THE DRAWINGS

FIG. 1 is a cross-sectional side view of one type of a chemical reactor.

FIG. 2 is a greatly exaggerated cross-sectional side view of the support plate of the prior art.

FIG. 3 is a greatly exaggerated cross-sectional side view of one embodiment of a support plate used in the improved reactor of the present invention.

DETAILED DESCRIPTION OF THE DRAWINGS

Figure 4:
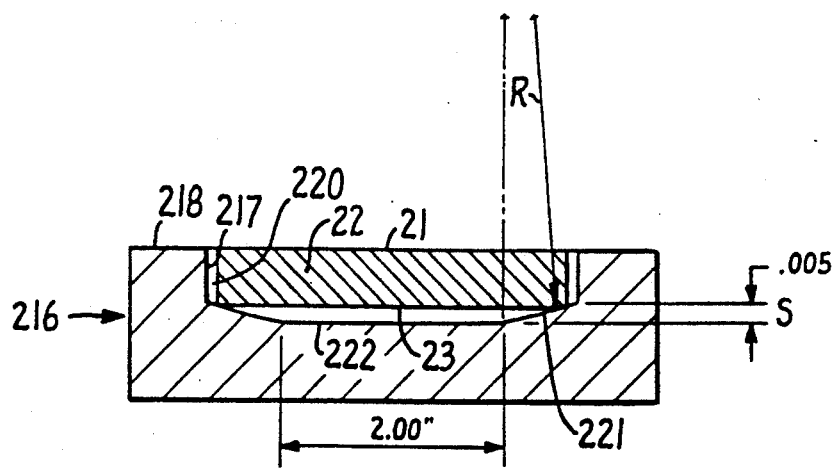
FIG. 4 is a greatly exaggerated cross-sectional side view of another embodiment of a support plate used in the improved reactor of the present invention.

Referring to FIG. 1, there is shown a typical reactor 10. The reactor 10 comprises a bell jar 12 to confine a reaction chamber 14 therein. Within the bell jar 12 is a support plate 16 called a susceptor, typically made out of graphite. The susceptor 16 has an upper surface 18. Referring to FIG. 2, there is shown the wafer 22, a disc shaped wafer of single crystalline silicon, having two substantially planar parallel surface 21 and 23, which is supported by the susceptor 16 on the one surface 18. A source of heat such as from a coil 26 to which radio frequency energy is supplied, is positioned adjacent a surface 24 opposite the one surface 18. Other types of heat source include infrared lamps. As previously discussed, either the lamps or the coils 26 or both can be positioned adjacent the one surface 18 and/or the opposite surface 24. Gases for reacting within the bell jar 12 and for depositing a layer of material epitaxially onto the wafer 22 are provided by the means 30 and are supplied to the bell jar 12. Means 30 also regulates the flow of the gases. The gases enter into the bell jar 12 and pass through the line 32 and radiate from the center of the reactor 10. All of the foregoing described elements are well known in the prior art.

The reactor of the prior art comprises the reactor 10 with a susceptor 16, a part of which is shown in FIG. 2. In the surface 18 the susceptor 16 has at least one cavity 20 into which the wafer 22 is placed. The cavity 20 is cylindrically shaped with a flat, planar bottom surface 25. The wafer 22 is supported by the susceptor 16 in the cavity 20 such that substantially all of a wafer surface 23 rests on the bottom surface 25 of the susceptor 16.

Figure 6:
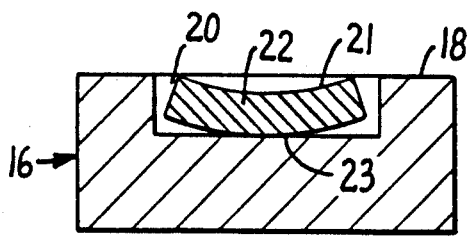
FIG. 6 is a greatly exaggerated cross-sectional side view of the support plate of the prior art and with what is believed to be the shape of the wafer during the depositing process.

This type of susceptor configuration is not satisfactory for epitaxial deposition of a layer with little or no slip. The problem is believed to be as follows. In the susceptor 16 used in the reactor of the prior art, the wafer 22 is in contact with the susceptor 16 in the cavity 20 over substantially the entire surface 23. Heat is supplied to the wafer 22 primarily by conduction from the susceptor 16 through the surface 23. The other surface 21 of the wafer 22 facing away from the susceptor 16 is exposed to the chamber 14. As the heat from the susceptor 16 heats the wafer 22, the surface 23 of the wafer 22 is at a different temperature than the other surface 21 of the wafer 22. As a result, a temperature difference or thermal gradient exists between the two surfaces 21 and 23. The surface 23 which is hotter than the other surface 21, expands at a faster rate. The water 22 then becomes bow-shaped, shown greatly exaggerated in FIG. 6. Bowing of the wafer 22 causes the wafer 22 edges to lose physical contact with the susceptor, further increasing the temperature gradient between the surfaces 21 and 23 which produces further bowing. This causes a radial thermal gradient between the high center temperature and cooler outside edge temperatures of wafer 22. The resulting thermal stress causes crystallographic dislocations to occur in the wafer material during the heat-up cycle. When the layer of material is epitaxially deposited on the other surface 21, the epitaxial layer follows the shape of the wafer 22 and is also bow-shaped. However, when the wafer 22 with the layer is cooled, returning it to the substantially planar shape, dislocations, or slip, occur in the layer of material deposited and in the wafer 22 itself.

Figure 7:
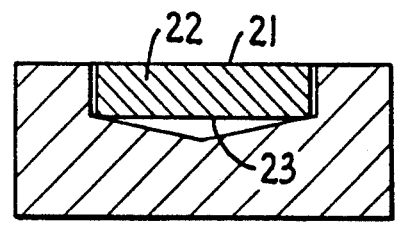
FIG. 7 is a greatly exaggerated cross-sectional side view of a support plate in which dislocation was found to worsen.
Figure 8:
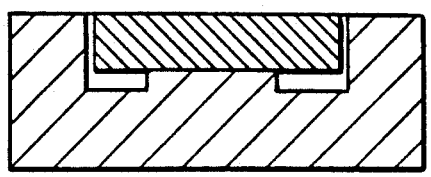
FIG. 8 is a greatly exaggerated cross-sectional side view of another support plate in which dislocations was found to worsen.
Figure 9:
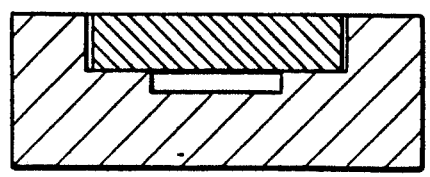
FIG. 9 is a greatly exaggerated cross-sectional side of yet another support plate in which found to worsen.

Various designs have been attempted to solve the unsatisfactory generation of slip by a flat heating surface. Designs providing a gap between the surface 23 of the wafer 22 and the susceptor, which would permit the susceptor to heat the wafer 22 by radiation and conduction, have been found insufficient to reduce dislocation. Seemingly these designs would appear to equalize the heat transfer from the susceptor to various points of the wafer 22. In fact, where a cavity is conically shaped, as shown in FIG. 7, or is a double recess as shown in FIG. 8, or is a ring groove as shown in FIG. 9, the number and the extent of dislocations in the wafer 22 increase. Therefore, the particular shape of the cavity in the susceptor for supporting the wafer 22 has an important effect on the number and extent of dislocations in the layer of material grown epitaxially on the wafer 22, and in the wafer 22.

Figure 5:
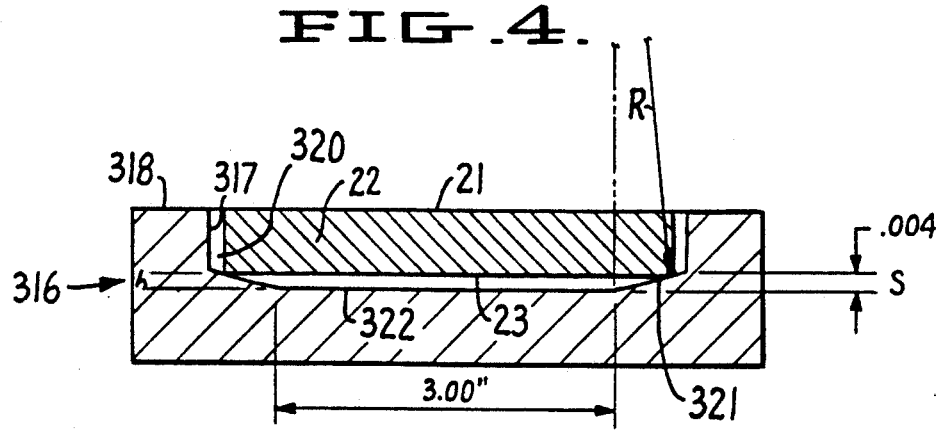
FIG. 5 is a greatly exaggerated cross-sectional side view of yet another embodiment of a support plate used in the improved reactor of the present invention.

The present invention comprises the reactor 10 with novel susceptors as shown in FIGS. 3, 4 and 5.

The susceptor 116 in FIG. 3 has a surface 118 and a cavity 120 therein. The cavity 120 has a circularly shaped straight side wall 117 with a curvilinearly shaped bottom surface 119. The wafer 22 rests in the cavity 120. The cavity 120 is shaped for supporting the wafer 22 on its surface 23 facing the bottom surface 119 such that substantially all of the surface 23 is not in contact with the susceptor 116. The wafer 22 is supported at the edge of the surface 23 and a gap exists elsewhere between the wafer surface 23 and the susceptor 116. The bottom surface 119 of the cavity 120, shown in FIG. 3, is spherically-shaped. It should be emphasized that the drawing shown in FIG. 3 is greatly exaggerated and that the cavity 120 is extremely shallow.

Referring to FIG. 4, there is shown another novel susceptor 216 for use in the reactor 10. The susceptor 216 comprises a surface 218 having a cavity 220 therein, with the cavity 220 receiving a wafer 22. The cavity 220 is, again, extremely shallow. The cavity 220 has a circularly shaped side wall 217 with a curvilinearly-shaped side surface 221 and a substantially planar circularly shaped bottom surface 222. The diameter of the bottom surface 222, should be less than the diameter of the wafer 22. As shown in FIG. 4, the bottom surface 222 has a diameter of approximately two inches (3.08 cm). The side surface 221 has a radius of curvature of approximately 225 inches (571.5 cm). The depth S of the curvilinear area of the cavity 220 is approximately 0.005 inch (0.127 mm).

The side surface 221 is arranged such that the curved concave surface 221 is a smooth continuation of the bottom surface 222. In other words, where the surfaces 221, 222 meet, the radius of curvature is perpendicular to both surfaces 221, 222. On the other hand, there is a discontinuity where the curved side surface 221 and side wall 217 meet. There is a similar relationship between the bottom surface 322 and the side surface 321 of FIG. 5.

Referring to FIG. 5, there is shown yet another susceptor 316 for use in the reactor 10. The susceptor 316 has a surface 318 with a cavity 320 therein, for supporting the wafer 22. Similar to the cavity 220 shown in FIG. 4, the cavity 320 is circularly shaped with a straight side wall 317, and a curvilinear side surface 321. The curvilinear side surface 321 has a radius of approximately 125 inches (317.5 cm). A circular bottom surface 322 is substantially planar and has a diameter of approximately 3.0 inches (7.62 cm). The depth S of the curvilinear area of the cavity 320 is approximately 0.004 inch (0.102 mm). The susceptor 116, 216 or 316 is useful for supporting wafer 22 that are larger than 3 inches (7.62 cm) in diameter.

It has been discovered that, with the improved reactor of the present invention, which comprises the reactor 10 with the susceptors 116, 216, or 316, dislocations in the layer deposited epitaxially on the single crystalline wafer of silicon and in the wafer have been substantially reduced.

In the present invention the cavity of the susceptor is shaped such that the wafer 22 is supported at the edge of the surface 23 such that substantially all of the surface 23 is not in contact with the susceptor. There is a gap between the wafer 22 and the susceptor. Heat is conducted from the heated susceptor to the wafer 22 through the edge of the susceptor in contact with the susceptor. Heat from the susceptor is also transmitted to the wafer 22 by radiation where the wafer 22 is not in contact with the susceptor. This combination of conduction and radiation heating from the particular susceptor cavity design results in a more uniform heating of the wafer 22. The amount of thermal stress on the wafer is reduced to minimize the amount of crystallographic dislocations on the wafers.

With the new susceptor, a temperature gradient still exists between the top and bottom surfaces 21 and 23 of the susceptor 22 to cause the wafer 22 to bow. However, unlike the susceptor 16 of the prior art, as the wafer 22 bows it moves closer to the hot surface of the susceptor which reduces the temperature gradient between the two planar surfaces. This reduces the amount of thermal stress on the wafer 22 and results in the epitaxial layers having a minimal amount of slip. In addition, the heat from the side walls 117, 217 or 317 have a secondary effect in offsetting loss in energy from the edge of the wafer 22 due to radiation to improve wafer temperature uniformity.

From the standpoint of slip avoidance it would seem best to place the wafer 22 in a deep a cavity as possible so as to surround the wafer with heat sources for temperature uniformity. However, FIGS. 3, 4 and 5 illustrate that the top surface of the wafer 22 is substantially coplanar with the surface of the susceptor. This relationship permits the gas flow of the reactant gases to flow unimpeded by the susceptor cavity and over the wafer 22. This results in high uniformity in the thickness of the deposited epitaxial layer. Assuming that the wafer 22 rests on the side surface 221 very closely to the side wall 217, a side wall height of 0.8 to 2.0 times the thickness of the wafer 22 places the top surface of the wafer near the top surface of the susceptor for the best results in deposition layer uniformity.

The present invention has an optimum configuration of susceptor design which has a cavity 200 in the susceptor surface 218 as shown in FIG. 4. The cavity 200 has a side wall 217, side surface 221 and planar bottom surface 222. The side surface 221 has a radius of curvature of 225 inches, which has been found to have an extraordinary effect in reducing slip in deposited epitaxial layers compared to other radii of curvature. A range of radii of curvature, 200–250 inches, about 225 inches is believed to be especially efficacious in reducing slip.

The optimum configuration has a particular height h of the wafer 22 above the bottom surface 222 to the lower wafer surface 23 during the epitaxial deposition process which must also be considered in reducing slip. The height h is dependent upon the size of the wafer 22 and the temperature at which the epitaxial layer is deposited. As explained previously, the wafer 22 bows appreciably at the high temperatures (1000 degrees Centigrade and above for silicon wafers) associated with epitaxial deposition processes. The height h should be such that the wafer 22 is heated relatively uniformly to minimize slip. If h is too large, then the center of the wafer 22 still remains too far away from the bottom surface 222 to receive enough energy for temperature uniformity through the wafer 22 as it deflects toward the susceptor. The wafer center is relatively cold compared to the edges of the wafer. On the other hand, if h is too small for the temperature selected, the center of the wafer 22 bows too close to the susceptor. The wafer center receives too much energy from the surface 222. In fact the center of the wafer 22 may even touch the surface 222 (h=0) to cause a slip pattern in a typical star burst shape.

Table A shows the range of optimum values for height h for a given wafer size (diameter) and temperature.

TABLE A

| | | (h in thousandths of an inch) | | | |
|---|---|---|---|---|---|
| | | Wafer Size | | | |
| (True) | | 3" | 4" | 5" | 6" |
| Process | 1000° | 1.02 | 1.82 | 2.84 | 4.09 |
| Temp. | 1050° | .92 | 1.62 | 2.57 | 3.70 |
| Celsius | 1100° | .81 | 1.45 | 2.26 | 3.26 |
| | 1150° | .69 | 1.23 | 1.92 | 2.76 |
| | 1200° | .55 | .98 | 1.54 | 2.21 |

To attain these values for h during an epitaxial deposition process, the depth S of the cavity 200 must be determined with respect to the wafer size. Table B shows the range of optimum S values. It should be understood that in manufacturing these cavities, tolerances are typically ±0.5 thousandths of an inch. Hence a cavity built according to these dimensions typically falls within a range of values about the target values given here.

TABLE B

| (S in thousandths of an inch) | | | |
|---|---|---|---|
| Wafer Size | | | |
| 3" | 4" | 5" | 6" |
| 1.8 | 3.0 | 5.0 | 7.0 |

It should be noted that these S values in Table B are calculated with the assumption that diameter of wafer 22 is nearly equal to that of the wafer cavity 220. Thus, before heating, the lower wafer surface 23 facing the susceptor is appoximately the distance S above the susceptor surface 222 i.e., S is approximately equal to h.

Of course, the wafer 22 can be much smaller that the wafer cavity 220 as mentioned previously. Table A still indicates the desired range of h for a selected process temperature and wafer size. The depth S of the cavity may be designed accordingly. Other dimensions of the cavity, such as the diameter of the bottom surface 222, follow. When the wafer is heated to the given temperature, it will sag the appropriate amount toward the susceptor surface 222 for uniform heating of the wafer 22.

It should also be clear that the present invention is not limited to horizontal susceptor surfaces and cavities. The previous discussion is equally applicable to susceptor surfaces and cavities tilted vertically or in varying degrees to the vertical.

As will be understood by those familiar with the art, the present invention may be embodied in other specific forms without departing from the spirit or essential characteristics thereof. Accordingly, the disclosure of the preferred embodiment of the invention is intended to be illustrative, but not limiting, of the scope of the invention which is set forth in the following claims.

What is claimed is:

1. A susceptor for an epitaxial, chemical vapor deposition said susceptor having at least one circularly shaped cavity in a surface thereof to receive a semiconductor wafer, said cavity having a planar bottom portion, side walls perpendicular to said susceptor surface, and a curved side surface between said bottom portion and said side wall, said side surface having a radius of curvature of 225 inches measured from a point above said susceptor.

2. A susceptor for an epitaxial, chemical vapor deposition reactor, said susceptor having at least one circularly shaped cavity in a surface thereof to receive a semiconductor wafer, said cavity comprising:

a side wall forming a right cylinder in said susceptor surface;

a curved side surface portion contacting said side walls, said curved side surface portion having a radius of curvature of 225 inches measured from a point above said susceptor; and a planar bottom portion contacted and surrounded by said side surface portion.

* * * * *